United States Patent
Nilsson

[11] Patent Number: 5,856,990
[45] Date of Patent: Jan. 5, 1999

[54] OPTICAL AMPLIFYING DEVICE

[75] Inventor: Olle Nilsson, Apelvägen 3, Sweden

[73] Assignee: Telefonaktiebolaget LM Ericsson, Stockholm, Sweden

[21] Appl. No.: 775,911

[22] Filed: Jan. 2, 1997

Related U.S. Application Data

[63] Continuation of Ser. No. 303,621, Sep. 9, 1994, abandoned.

[30] Foreign Application Priority Data

Sep. 10, 1994 [SE] Sweden .................................. 9302949

[51] Int. Cl.⁶ ..................................................... H01S 3/19
[52] U.S. Cl. ................................ 372/50; 372/45; 359/344
[58] Field of Search ..................................... 359/344, 174, 359/179; 372/43, 50, 96, 45

[56] References Cited

U.S. PATENT DOCUMENTS

| | | | |
|---|---|---|---|
| 5,115,442 | 5/1992 | Lee et al. | 372/45 |
| 5,132,982 | 7/1992 | Chan et al. | 372/50 |
| 5,212,701 | 5/1993 | Choquette et al. | 372/45 |
| 5,212,706 | 5/1993 | Jain | 372/50 |

OTHER PUBLICATIONS

Edwards, "Low–Noise Optoelectronic Amplifier using Sub–Shot Noise Light", Electronics Letters, vol. 29, No. 3, pp. 299–301, Feb. 4, 1993.

*Primary Examiner*—Rodney Bovernick
*Assistant Examiner*—Yisun Song
*Attorney, Agent, or Firm*—Burns, Doane, Swecker & Mathis, L.L.P.

[57] ABSTRACT

An optical amplifying device for amplification of an optical signal incident to a photo diode comprises a laser device and an electrical feeding circuit. The laser device is so formed that it comprises one single laser device comprising a number of active regions or laser structures electrically connected in series within one and the same optical cavity.

18 Claims, 2 Drawing Sheets

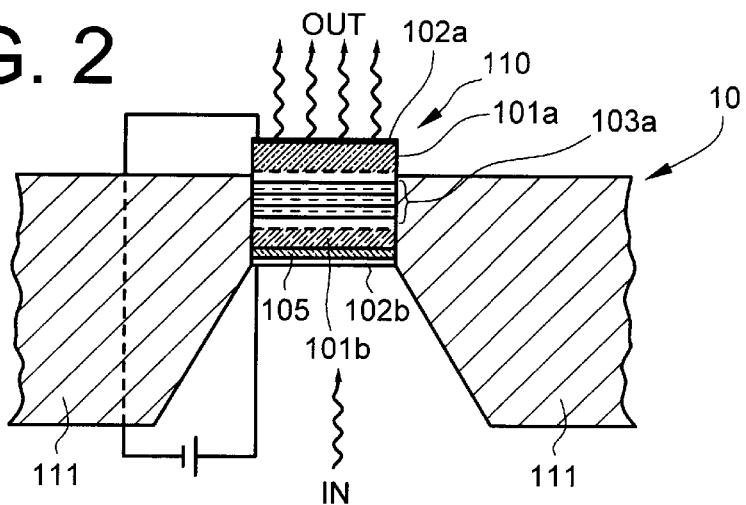
FIG. 2
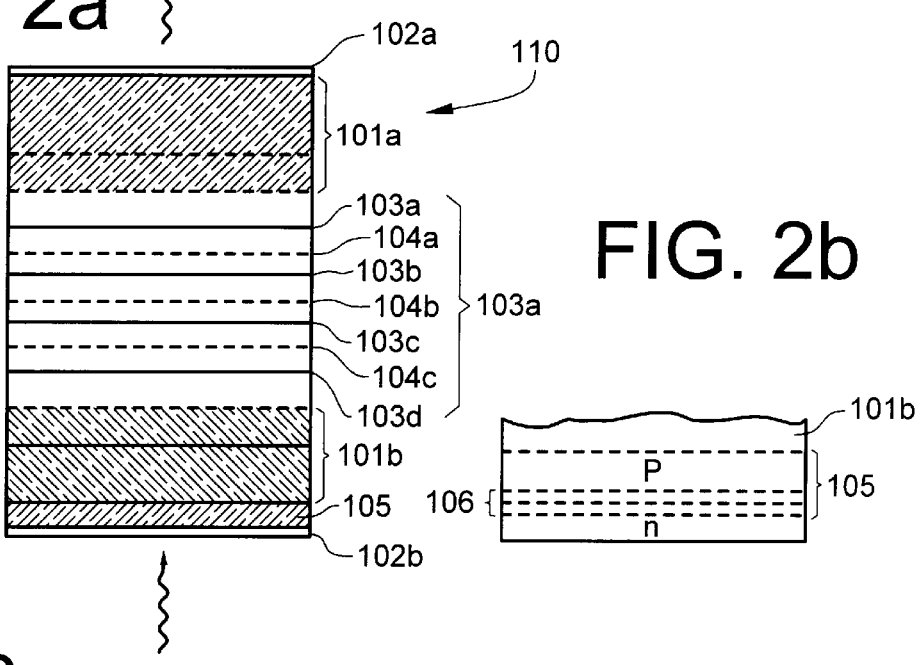
FIG. 2a
FIG. 2b
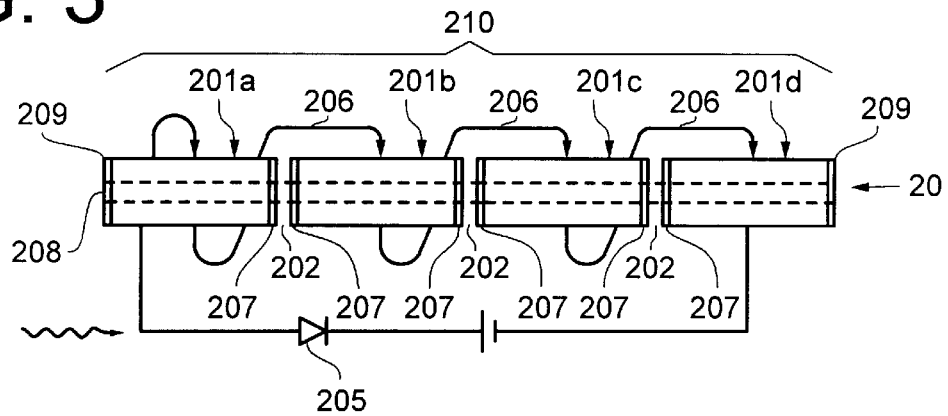
FIG. 3

OPTICAL AMPLIFYING DEVICE

This application is a continuation of application Ser. No. 08/303,621, filed Sep. 9, 1994 now abandoned.

BACKGROUND

The present invention relates to an optical amplifying device for amplification of an optical signal incident towards a photo diode comprising a laser device and an electrical feeding circuit. The invention also relates to the use of such devices. Optical amplifying devices are used among others in optical transmission technology such as in optical transmission systems etc for amplification of optical signals. Among others they are used as repeater elements for regeneration of optical signals, for example within telecommunications etc. Such devices are however often complicated since amplifying electronics is required and therefore also noise may strongly influence the device. Furthermore often a considerable number of separate components are required which may result in the device being complicated and sensitive.

A number of different amplifying devices are known, for example laser amplifiers, among others semi-conductor amplifiers and erbium doped fibre amplifiers. These known devices however require advanced electronic equipments which as such make the devices complicated. Therefore the noise level often gets high. Furthermore a larger number of separate or non-integral components are required which among others make such devices expensive.

In "Low Noise Opto Electronic Amplifier using Sub Shot Noise Light" of P. J. Edwards in Electronics Letters 4th Feb. 1993, Vol 29, No. 3, a low noise opto electronic amplifier is described. This device is illustrated schematically in FIG. 1 and it comprises a number of (in the shown embodiment 4) diode lasers or light diodes (LEDs) connected in series. In this case four separate lasers are interconnected. When an optical signal is incident towards a photo diode four, as far as the output power is concerned, essentially exact replicas of the input signal are obtained. These replica or output signals are however optically incoherent which often leads to a number of limitations for the device practically as well as economically.

SUMMARY

An object with the present invention is to provide a good optical amplifying device as initially referred to which only to a very small extent is exposed to noise, i.e. a low noise device, and which in principle can be made essentially free from noise. A further object with the invention is to provide a device which does not require amplifying electronics. It is still another object with the invention to provide a device which is very compact and which only, if at all, requires very few separate components. Another object with the invention is to provide a device which for example can be used in optical connections (Optical Interconnects) for example between semi-conductor chips. Another object with the invention is to provide a device which is generally free of noise in connection with intensity modulation which gives very low signal effects with a maintained low bit error frequency. Furthermore it is an object with the present invention to provide a device which is cheap and simple to fabricate and which for example can be used as a low cost repeater element. Particularly it is an object to provide a device through which an optical signal can be regenerated and amplified without the signal being contaminated by noise. A particular object with the invention is to provide a device through which a coherent or preferably single-moded optical output signal is obtained from the cavity directly without any surrounding equipment. According to a particular object the invention can also be used for wavelength conversion.

These as well as other objects are achieved through a device comprising one single laser device with a number of active regions which are electrically connected in series within an optical cavity. The objects are also achieved through electrical connection in series of a number of laser structures within one optical cavity. More particular uses of the device are for optical interconnects, for wave-length conversion or for the provision of amplified replicas of an incident optical signal.

Advantageously through the device a coherent, optical output signal is obtained from the cavity. According to an advantageous embodiment the photo diode or photo diodes are integrated in the device. According to an alternative embodiment the photo diode or the photo diodes are arranged separately externally to the device. According to a particular embodiment the laser device comprises a surface emitting laser device with a vertical cavity. Then may particularly electrically active regions connected in series be alternated with electrical contact regions. More particularly the laser device is so formed that a vertical, optical standing wave pattern is created in the cavity. Furthermore the active regions and contact regions are advantageously perpendicular to the direction of propagation of the standing waves. More particularly the active regions are arranged in horizontal planes corresponding to maximum electro optical field whereas the electrical contact areas are arranged in horizontal planes corresponding to minima in the optical electrical field. Particularly the optical cavity is surrounded by dielectric mirror arrangements, particularly dielectrical Bragg devices in a vertical direction. According to one example the device comprises four active regions. In a particularly advantageous embodiment providing a very compact device, a reversed photo diode is arranged between one of the dielectric reflection devices and a contact layer arranged outside said dielectric reflection device, wherein an optical signal is incident towards said photo diode. More particularly the electrical contact layer which is arranged on the reversed photo diode is transparent.

According to an alternative embodiment the optical cavity is essentially longitudinal and comprises a number of laser structures electrically connected in series which are arranged therein. Those surfaces of each laser structure which form a boundary towards another laser structure are then advantageously provided with an anti-reflecting coating or similar. Particularly the separating regions or the junctions between the laser structures comprise regions with a higher resistivity. According to a particular embodiment each laser structure comprises a per se known, conventional laser structure. Furthermore, according to a particular embodiment the laser device comprises four laser structures. Generally the amplification is proportional to the number of layers and of course the number of layers can be chosen freely.

According to a particular embodiment the electrical circuit may comprise a current limiting device.

The laser device may furthermore comprise a DBR laser or a DFB laser which comprises a number of laser structures connected in series.

Embodiments wherein the optical cavity is essentially longitudinal or alternatively vertical are described in Applicant's copending U.S. patent applications "Laser device with laser structures connected in series in an optical cavity", application Ser. No. 08/303,624 filed Sep. 9, 1994 now U.S. Pat. No. 5,568,498 and "Surface emitting laser device with a vertical cavity" application No. 08/303,623, filed Sep. 9, 1994 now abandoned respectively. Both of these applications are incorporated by reference in this application.

The device may for example be used to obtain an amplified replica of an optical signal incident to the photo diode. The device can furthermore be used for optical interconnections (Optical Interconnects) for example between two or more semi-conductor chips. An alternative use of the device is as a wavelength converter, i.e. the output signal may have another wavelength than the input signal by the photo diode being intended for one wavelength whereas the lasing of the device occurs for another wavelength.

BRIEF DESCRIPTION OF THE DRAWINGS

The invention will in the following be further described in a non-limiting way under reference to the accompanying drawings wherein FIG. 2 illustrates the device in an integrated form in a vertical optical cavity, FIG. 2a more in detail illustrates the laser device of FIG. 2, FIG. 2b more in detail illustrates the integrated photo diode, FIG. 3 schematically illustrates an embodiment including a current limiting device, and FIG. 4 schematically illustrates an embodiment wherein the laser device comprises a number of laser structures connected in series in a longitudinal cavity.

DETAILED DESCRIPTION

Figure 1:
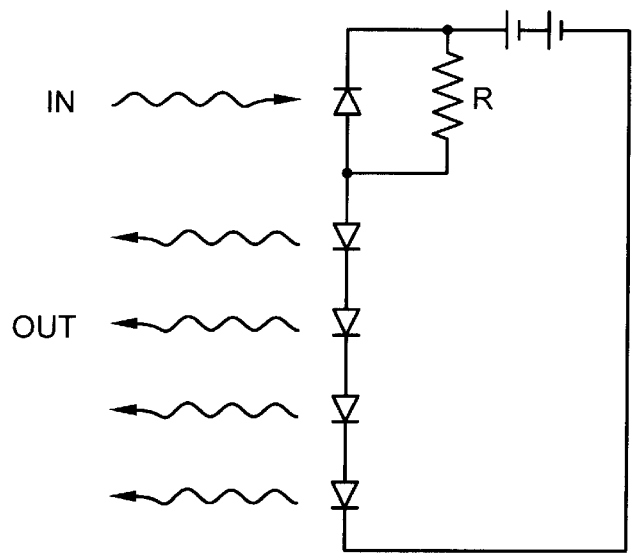
FIG. 1 illustrates an opto-electronic amplifier.

FIG. 2 illustrates one embodiment of an amplifying device 10 wherein the laser device 110 is surface emitting with a number of active regions forming a "total active region", i.e. a number of active regions in a cavity 103a. The laser device is also described in the abovementioned at the same time filed patent application "Surface emitting laser device with a vertical cavity". The "total active region" 103a which comprises a number of active regions with intermediate contact regions is vertically surrounded by a first dielectric Bragg mirror device 101a and a second dielectric Bragg mirror device 101b respectively. On top of the upper Bragg mirror device 101a is arranged a contact layer 102a which may comprise a metal layer or similar. Under the lower Bragg mirror device 101b is arranged a reversed photo diode 105 which will be further described under reference to FIG. 2b. Under this photo diode 105 is arranged a contact layer 102b in the form of a contact electrode or similar and it may comprise a thin metal layer. The contact layers 102a, 102b are connected to a battery or a voltage source in such a way that the photo diode 105 is reversed, alternatively is this so formed in relation to the battery or to the voltage source. The amplifying device is arranged on a chip 111, in the shown embodiment the amplifying device 10 is arranged in such a way that it protrudes but it can also be embedded or recessed in the substrate 111. With an optical signal incident to the reversed photo diode 105 on which the electrical contact layer 102b is arranged which preferably is transparent, amplified, coherent light will be emitted upwards as can be seen from the figure. The laser device 110 itself with the reversed photo diode 105 is illustrated more clearly in FIG. 2a. The electrical circuits are not further described since they are common. Furthermore they provide for a fast grinding or "gating" of an incident photon bit-stream. In the embodiment illustrated in FIG. 2 the photo diode 105 is integrated in the laser device 110. Therefore the amplifying device 10 will be very compact. For example it is possible to use it in optical interconnections (Optical Interconnects) for example between two semi-conductor chips. The chip 111 is for example a semi-conductor plate.

FIG. 2a describes an embodiment of the laser device 110 with an integrated reversed photo diode 105. In the shown embodiment the first Bragg mirror device 101a is arranged at the upper part of the vertical device and according to the shown embodiment it is advantageously somewhat transparent. The top contact layer 102a is furthermore in the illustrated embodiment translucent or transparent. The lower Bragg mirror device 101b is according to the shown embodiment strongly reflecting and under this the reversed photo diode 105 is arranged under which 105 the electrical contact layer 102b is arranged which is transparent. The mirror devices 101a, 101b in the shown embodiment vertically surround four active regions or layers 103a, 103b, 103c, 103d between which contact regions or contact layers 104a, 104b, 104c are arranged. The active regions may be weakly n-doped (n⁻). They can of course be weakly p-doped (p⁻) or something else. Particularly the active regions or layers 103a, 103b, 103c, 103d may be of a quantum well structure. The contact layers 103a, 103b, 103c may e.g. be in form of tunnel diodes with thin, highly doped layers but also other alternatives are possible. Every contact layer or contact region 104a, 104b, 104c is located in a plane corresponding to a minimum in optical intensity whereas each active region 103a, 103b, 103c, 103d is located in regions corresponding to a maximum in optical intensity. In the device an optical standing wave pattern is created for example upon feeding with an electrical feeding signal with four intensity peaks. The standing wave pattern declines in the Bragg mirror devices 101a, 101b. The optical losses are considerably reduced since the maxima merely occur in precisely the active regions. With four active regions the voltage drop is multiplied by four. The amplification will then be stronger without the voltage drop over the Bragg mirror devices (which corresponds to a parasitic voltage drop) being larger. Through this form the relative importance of the mirror losses is reduced at the same time as the current can be reduced for a given output, i.e. the impedance increases. The voltage drop over the active regions, i.e. the useful voltage drop will in the shown embodiment be four times larger since the device comprises four active regions connected in series. Likewise the amplification is increased through the four active regions. The number four is of course merely given as an example, there may be fewer as well as more depending on the desired degree of amplification. As mentioned above the amplification increases with the number of active layers.

FIG. 2b illustrates the reversed photo diode 105 and a thin metal layer 102b arranged under that forming an upper contact. Since the photo diode 105 is reversed, a barrier layer 106 is created. An incident photon generates charge carriers in the barrier layer whereupon current goes through the active regions 103a, 103b, 103c, 103d (see FIG. 2a). The p-n-diode is merely shown in a simplified manner. In reality it may of course be much more complicated with different bandgaps, etc. in particular in order to provide very high efficiencies, etc. The battery illustrated in FIG. 2 is merely shown very schematically. Of course this can be connected in a number of different ways but this merely constitutes solutions which are known per se. The device described in this embodiment is particularly very compact.

In FIG. 3 an amplifying device 20 is illustrated with a laser device 210 comprising four in one and the same optical cavity arranged laser structures 201a, 201b, 201c, 201d which essentially are arranged in one row in the optical direction of propagation and wherein the optical cavity is longitudinal. The device is a so called edge emitting device. Between the laser structures 201a, 201b, 201c, 201d there are no conducting junctions and in the shown embodiment the outer surfaces 209, 209 of the laser device comprise cleaved reflecting surfaces. Those surfaces of each respective laser structure which form a boundary with another laser structure are provided with an anti-reflection layer 207 and the laser structures 201A, 201B, 201C, 201D of the device are arranged so close to each other that no optical losses occur. Of course the number of laser structures can be fewer than four as well as more; four is merely given as an example. In the shown embodiment each laser structure 201A, 201B, 201C, 201D is formed by a lower electrode and an upper electrode between which a laser wave guide 208 with active regions is arranged. The electrodes are split up into a number of structures which are electrically isolated from each other in such a way that they can be electrically connected in series via a wire, conductor 206 or similar. This wire or conductor 206 may of course also be formed in a number of different ways, for example it may comprise a connection which comprises a structure which is produced through metal deposition, etching etc. According to the shown embodiment the lower electrode of a laser structure 201a is via the wire 206 connected to the upper electrode of the following laser structure 201b. The separation regions or the junctions 202 between the laser structures are formed of regions with a high resistivity. Each laser structure may for example comprise a conventional laser structure which is known per se. Alternatively the laser device comprises a DFB laser or alternatively a DBR laser. Then the structures are electrically connected in series in a longitudinal cavity etc. In the shown embodiment the photo diode 205 is arranged externally. Of course it may be arranged in a number of other ways not shown herein, but this should be obvious. A device as described above particularly shows a very great flexibility.

Through this device an amplifying device is obtained with the properties as initially referred to wherein the laser device furthermore is so formed that a large "useful" voltage drop is obtained as well as a large dynamic impedance, effects which can be seen as positive extra effects which are obtained freely.

Figure 4:
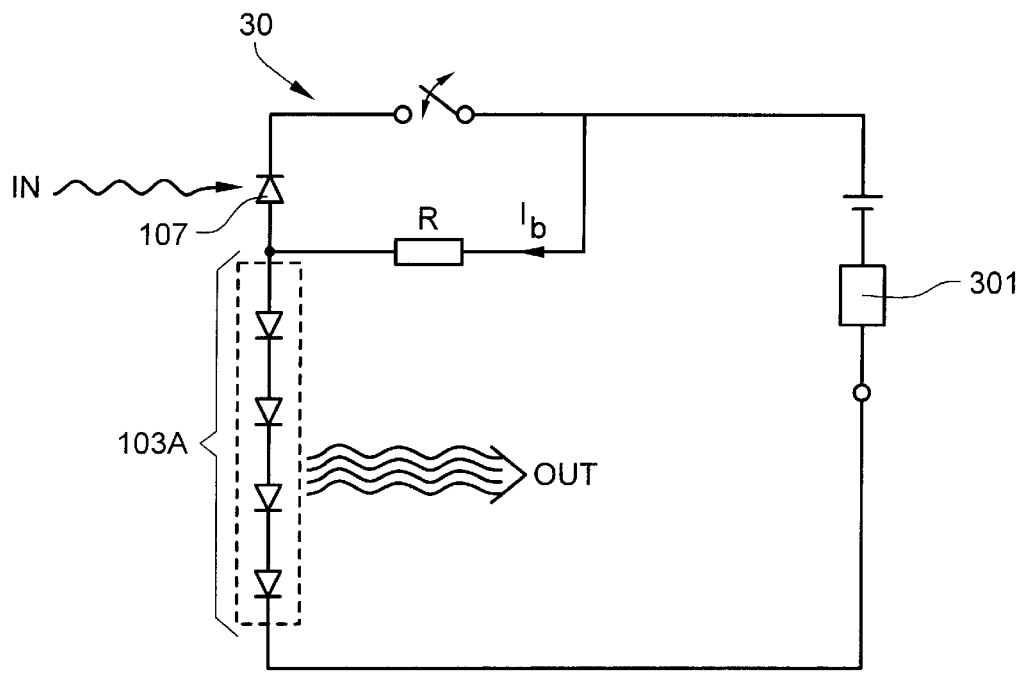

In FIG. 4 an optical amplifying device 30 is illustrated which similar to the amplifying device 10 as illustrated in FIG. 2 comprises a laser device with a number of active regions 103A electrically connected in series in an optical cavity. Furthermore the device comprises a current limiting device 301. This is arranged in the electrical feeding circuit and therefore a regenerating function is obtained so that noise that might be present does not propagate through the amplifying device. The shown embodiment also illustrates a grinding function ("gating") since synchronous gating limits the problems which can arise in connection with jitter, i.e. the variation that may be present in relation to the starting up time or internal adaption to starting up. In FIG. 4 $I_b$ illustrates a biasing current. In the figure can be seen how an optical input signal is incident towards the photo diode 107 and how the signal as amplified and coherent comes out from the "total active region" 103a, i.e. the cavity with active regions.

The invention is of course not limited to the shown embodiments but can be freely varied within the scope of the claims.

What is claimed is:
1. An optical amplifying device for providing amplification of an optical signal incident to a photo diode comprising a laser device and an electrical feeding circuit, wherein the laser device comprises one single laser device comprising a number of active regions electrically connected in series within one and the same optical cavity; the laser device is a surface emitting laser device having a vertical cavity so formed that a vertical standing wave pattern is created in the cavity; a signal is obtained from the optical cavity generated in one single beam that comprises only one mode; electrical contact regions are disposed between the active regions; the active regions and electrical contact regions are substantially perpendicular to a direction of propagation of the vertical standing wave pattern; the active regions are arranged in planes corresponding maxima in an electro-optical field; and the electrical contact regions are arranged in planes corresponding to minima in the electro-optical field.

2. A device as in claim 1, wherein the photo diode is integrated in the device.

3. A device as in claim 1, wherein the photo diode is arranged outside the device.

4. A device as in claim 1, wherein dielectrical reflecting devices, vertically surround the optical cavity.

5. A device as in claim 4, comprising at least four active regions.

6. A device as in claim 3, wherein dielectric reflecting devices vertically surround the optical cavity, and between one of the dielectric reflecting devices and a contact layer arranged outside the dielectric reflecting device, a reversed photo diode is arranged to which an optical input signal is incident.

7. A device as in claim 6, wherein the contact layer is transparent.

8. A device as in claim 1, wherein the optical cavity is substantially longitudinal and wherein a number of laser structures are arranged therein which are electrically connected in series.

9. A device as in claim 8, wherein those surfaces on each laser structure respectively which form a boundary with another laser structure are provided with an anti-reflection coating.

10. A device as in claim 9, wherein junctions between the laser structures comprise regions with a high resistivity.

11. A device as in claim 10, wherein each laser structure comprises a laser structure which is conventional and known per se.

12. A device as in claim 8, wherein the laser device comprises at least four laser structures.

13. A device as in claim 8, wherein the electrical circuit comprises a current limiting device.

14. Optical device comprising a laser device and an electrical feeding circuit, wherein an optical signal is incident towards a photo diode to provide an optical output signal as one single beam that comprises only one mode and wherein the laser device comprises one single laser device with a number of active regions electrically connected in series within an optical cavity; the laser device has a cavity so formed that a standing wave pattern is created in the cavity; electrical contact regions are disposed between the active regions; the active regions and electrical contact regions are substantially perpendicular to a direction of propagation of the vertical standing wave pattern; the active regions are arranged in planes corresponding maxima in an electro-optical field; and the electrical contact regions are arranged in planes corresponding to minima in the electro-optical field.

15. A method of communicating signals between two devices comprising the step of using an optical amplifying arrangement for an optical interconnection between the devices, the arrangement comprising a laser device with a number of active regions which are electrically connected in series within one optical cavity; the laser device has a cavity so formed that a standing wave pattern is created in the cavity; an optical signal is obtained from the cavity generated in one single beam that comprises only one mode; electrical contact regions are disposed between the active regions; the active regions and electrical contact regions are substantially perpendicular to a direction of propagation of the vertical standing wave pattern; the active regions are arranged in planes corresponding maxima in an electro-optical field; and the electrical contact regions are arranged in planes corresponding to minima in the electro-optical field.

16. A method of amplifying an optical signal comprising the step of using an optical amplifying arrangement comprising a laser device with a number of active regions which are electrically connected in series within one optical cavity and a photo diode to provide at least one amplified replica of the optical signal incident to the photo diode; wherein the laser device has a cavity so formed that a standing wave pattern is created in the cavity; the amplified optical signal is obtained from the cavity generated in one single beam that comprises only one mode; electrical contact regions are disposed between the active regions; the active regions and electrical contact regions are substantially perpendicular to a direction of propagation of the vertical standing wave pattern; the active regions are arranged in planes corresponding maxima in an electro-optical field; and the electrical contact regions are arranged in planes corresponding to minima in the electro-optical field.

17. The device according to claim 14, wherein the active regions are identical.

18. The device according to claim 14, wherein the impedance across the active regions for a given power is increased at the same time as the threshold current is lowered.

* * * * *